United States Patent
Raad

[11] Patent Number: 6,160,312
[45] Date of Patent: *Dec. 12, 2000

[54] ENBEDDED MEMORY ASSEMBLY

[75] Inventor: George B. Raad, Boise, Id.

[73] Assignee: Micron Technology, Inc., Boise, Id.

[ * ] Notice: This patent is subject to a terminal disclaimer.

[21] Appl. No.: 09/143,604

[22] Filed: Aug. 31, 1998

Related U.S. Application Data

[62] Division of application No. 08/990,303, Dec. 15, 1997, Pat. No. 5,869,895.

[51] Int. Cl.<sup>7</sup> ..................................................... H01L 23/34
[52] U.S. Cl. .......................... 257/723; 257/724; 257/666; 438/111; 438/107
[58] Field of Search .................................... 257/723, 724, 257/666, 777, 778, 207, 208, 209, 210, 211; 438/107, 108, 109, 110, 111

[56] References Cited

U.S. PATENT DOCUMENTS

| | | | |
|---|---|---|---|
| 4,774,630 | 9/1988 | Reisman et al. | 361/383 |
| 5,222,014 | 6/1993 | Lin | 361/414 |
| 5,237,434 | 8/1993 | Feldman et al. | 259/19 |
| 5,266,912 | 11/1993 | Kledzik . | |
| 5,454,160 | 10/1995 | Nickel | 29/840 |
| 5,491,612 | 2/1996 | Nicewarner, Jr, | 361/760 |
| 5,559,305 | 9/1996 | Lee et al. | 174/52.4 |
| 5,565,706 | 10/1996 | Miura et al. . | |
| 5,568,574 | 10/1996 | Tanquay, Jr. et al. | 385/14 |
| 5,652,462 | 7/1997 | Matsunaga et al. . | |
| 5,677,567 | 10/1997 | Ma . | |
| 5,801,433 | 9/1998 | Nakao et al. . | |
| 5,869,895 | 2/1999 | Raad . | |
| 5,907,166 | 5/1999 | Casper et al. . | |
| 6,043,557 | 3/2000 | Phelps, Jr. et al. . | |

*Primary Examiner*—Sheila V. Clark
*Attorney, Agent, or Firm*—Schwegman, Lundberg, Woessner & Kluth, P.A.

[57] ABSTRACT

Memory devices, such as random access memory, are affixed to an electrical contact frame and coupled to signals lines on the contact frame which is, in turn, mounted on a top surface of an integrated circuit. The signal leads are coupled to electrical contact pads disposed on the top surface of the integrated circuit. The contact pads and signal leads transfer control and power signals between the integrated circuit and the memory devices.

20 Claims, 6 Drawing Sheets

ENBEDDED MEMORY ASSEMBLY

This application is a continuation of U.S. Ser. No. 08/990,303, filed Dec. 15, 1997 now U.S. Pat. No. 5,869,895.

FIELD OF THE INVENTION

The present invention is related to integrated circuit packaging and in particular to embedding memory in the same package as an integrated circuit.

BACKGROUND OF THE INVENTION

One of the limitations of speed on a personal computer are the signal leads or traces on the motherboard that connect the microprocessor to memory devices such as random access memory. The length of the traces directly affects the speed at which signals can be exchanged between the microprocessor and the memory. Therefore, computer designers locate the memory as close to the microprocessor as possible within design constraints imposed by other components and the configuration of standard motherboards. As the complexity of personal computers increases and the size of the computer chassis decreases, the layout of the motherboard becomes a critical design limitation because of the clearances required between components on the motherboard, and between the motherboard and other integrated circuit boards in the chassis.

One solution to minimize the length of the traces has been to package the memory and the microprocessor together in the same assembly. However, doing so without radically modifying the configuration of the motherboard requires changing the die sizes of either the memory, the microprocessor, or both.

Therefore, there is a need for a combined microprocessor/memory assembly that minimizes the length of the traces without requiring changes to the die sizes of the microprocessor, or the memory, or to the configuration of the motherboard.

SUMMARY OF THE INVENTION

Memory devices, such as random access memory, are affixed onto an electrical contact frame and coupled to signals lines on the frame which is, in turn, mounted on a top surface of an integrated circuit,, such as a microprocessor, a controller chip, or an ASIC (application-specific integrated circuit). The signal leads are coupled to electrical contact pads disposed on the top surface of the integrated circuit. The signal leads carry the control and power signals between the integrated circuit and the memory.

The electrical contact pads are arranged in the center of the top surface of the integrated circuit. The signal leads are coupled to the electrical contact pads through ball bonds or metal pillars. Alternatively, the electrical contact pads are disposed around the perimeter of the top surface of the integrated circuit coupled to the signal leads through conventional bonding techniques.

The embedded memory assembly minimizes the signal leads running between the integrated circuit and the memory without requiring changes to the die sizes of the integrated circuit or the memory. Therefore, the profile of the integrated circuit is increased only minimally by the contact frame and the memory, requiring few, if any, changes in existing manufacturing techniques while increasing signal transfer speed between the integrated circuit and the memory.

When the embedded memory assembly is used in conjunction with a microprocessor for a computer, major modifications to the configuration of the motherboard and to the computer chassis are unnecessary. Thus, the enbedded memory assembly allows a computer manufacturer greater design freedom without sacrificing computer performance.

DESCRIPTION OF THE EMBODIMENTS

In the following detailed description of the embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present inventions is defined only by the appended claims.

The leading digit(s) of reference numbers appearing in the Figures corresponds to the Figure number, with the exception that the same reference number is used throughout to refer to an identical component which appears in multiple Figures. Signals and connections may be referred to by the same reference number or label, and the actual meaning will be clear from its use in the context of the description.

An embedded memory assembly places memory devices adjacent to a top surface of an integrated circuit such as a microprocessor, controller chip, or an ASIC (application-specific integrated circuit), and couples leads from the memory devices to memory-related signals from the integrated circuit through electrical contact pads located on the top of the integrated circuit.

Figure 1:
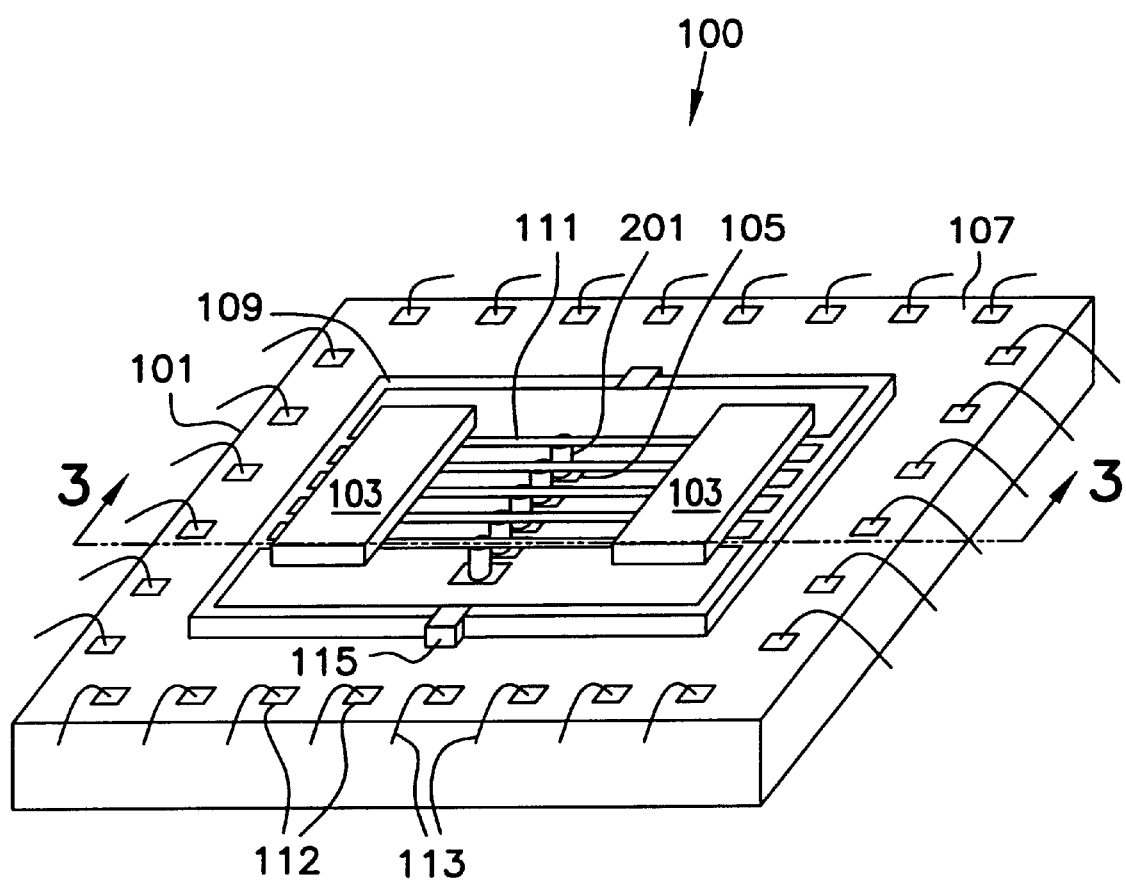
FIG. 1 is a perspective view of one embodiment of an embedded memory assembly having a microprocessor and memory devices.

FIG. 1 is a perspective view of one embodiment of the embedded memory assembly 100 having a microprocessor 101 and a plurality of memory devices 103. The memory devices 103 can be dynamic random access memory (DRAM), static random access memory (SRAM), electrically programmable read-only memory (EPROM), or other types of memory as will be readily apparent to one skilled in the art. A plurality of electrical contact pads 105 are disposed on a top surface 107 of the microprocessor 101 to transfer control and power signals from the microprocessor to the memory devices 103. The electrical contact pads 105 are formed of a solder alloy or a conductive polymer adhesive such as commonly used in flip chip assembly technology to attach a flip chip to a substrate. The microprocessor has standard bond pads 112 bonded to its lead frame and external leads 113 that transfer non-memory related signals to other computer components.

An electrical contact frame 109 is mounted adjacent to the top surface 107 of the microprocessor 101. The frame 109 is bonded to the microprocessor using an material such as an epoxy adhesive commonly used for die attachments. A plurality of signal leads 111 are coupled to the plurality of electrical contact pads 105 on the microprocessor 101. The electrical contact frame 109 is grounded through a tab 115. The memory devices 103 are affixed upside down on the electrical contact frame 109 and coupled to the plurality of signal leads 11. The electrical contact frame 109 can be a standard LOC (lead-on-chip or lead-over-chip) lead frame as illustrated in FIG. 1, or similarly constructed integrated circuit board having electrical traces acting as the signal leads 111. The traces are formed from solder or other conductive material, and are arranged in a pattern to route the control and power signals to the appropriate connectors on the memory devices 103. Some of the control and power signals are common to all the memory devices 103 while others are specific to a single memory device. A simplistic arrangement of the signal leads 111 is show in FIG. 1 for the sake of clarity, but alternate embodiments will be readily apparent to one skilled in the art. The memory devices 103 are bonded to the electrical contact frame 109 and coupled to the signal leads 111 using any one of a number of well-known techniques for attaching integrated circuits to lead frames or circuit boards.

Figure 2:
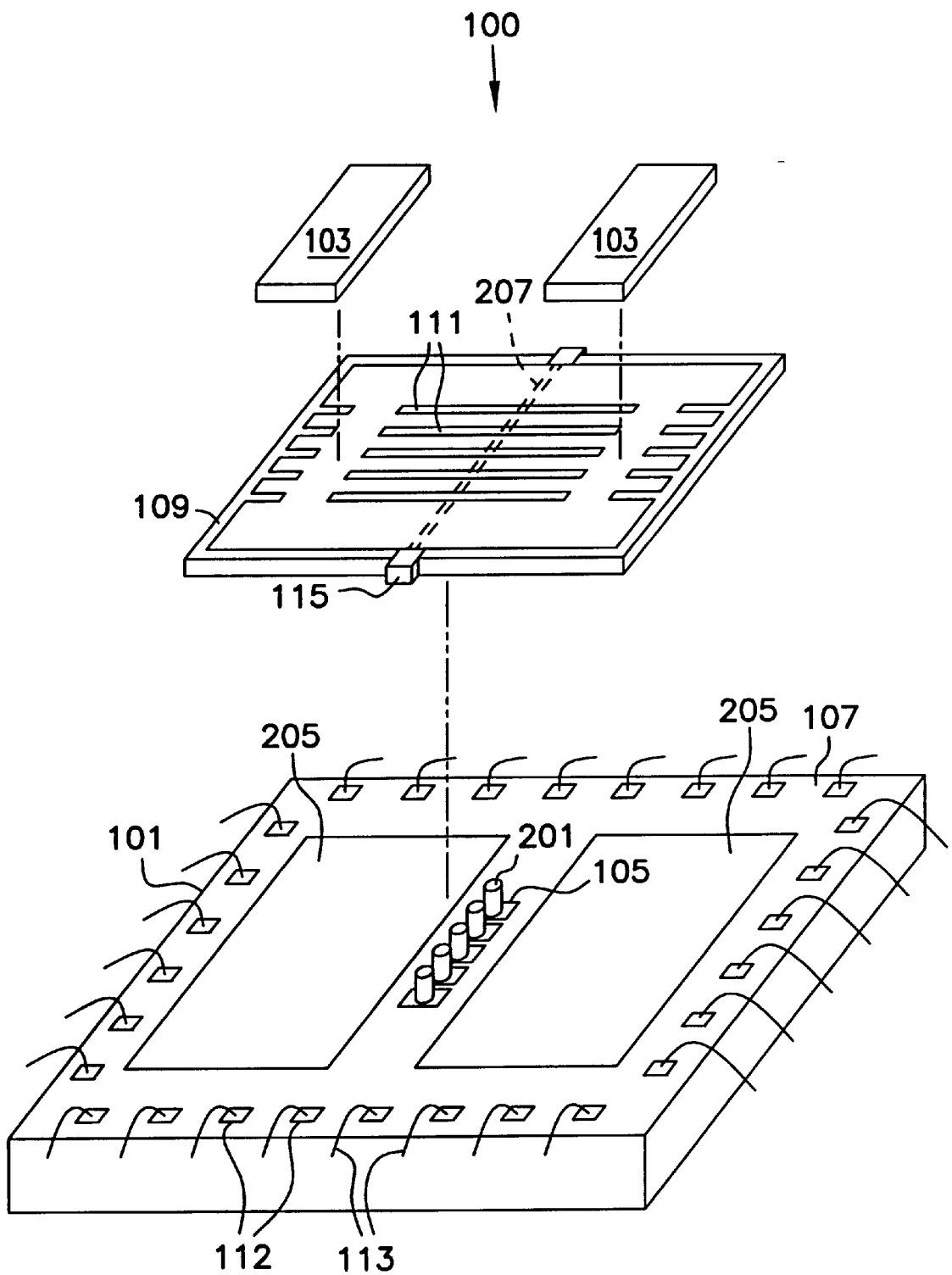
FIG. 2 is a partially exploded view of one embodiment of the embedded memory assembly of FIG. 1.

The plurality of electrical contact pads 105 are coupled to the plurality of signal leads 111 through electrical vias 201, generically illustrated as electrically conductive pillars in FIG. 2. In an alternate embodiment, the electrical vias are ball bonds. Additional coupling mechanisms will be readily apparent to those skilled in the art.

The signal leads 111 are formed as part of the manufacturing of the lead frame 109 and tie bar 207 maintains the structural integrity of the lead frame 109. The tie bar 207 is removed to electrically isolate the signal leads 111 from the lead frame 109 after the memory devices 103 are bonded to the lead frame 109 or after the lead frame 109 with the attached memory devices 103 is affixed to the microprocessor 101. In an alternate embodiment, the tie bar 107 is made of non-conductive material and therefore does not have to be removed to electrically isolate the signal leads 111 from the lead frame 109.

Figure 3:
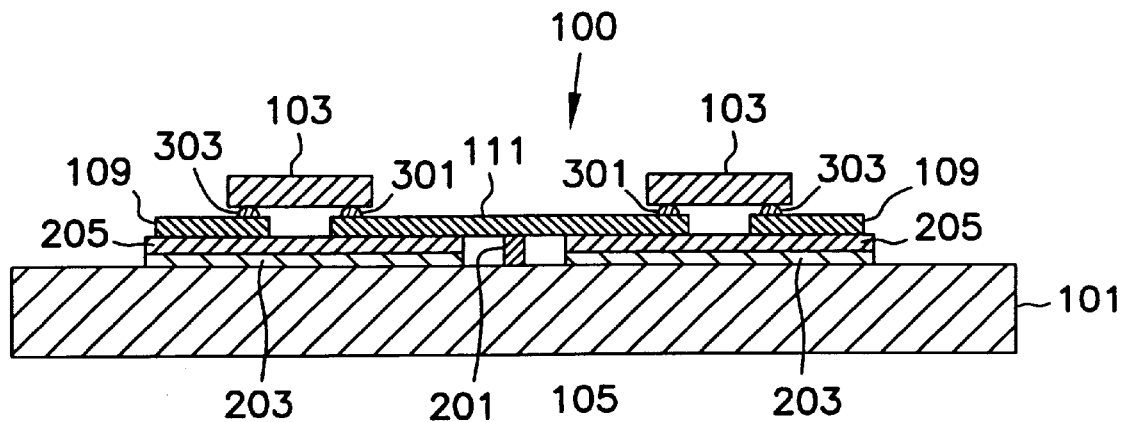
FIG. 3 is a sectional view of the embedded memory assembly of FIG. 1 taken on the line 3—3.

FIG. 3 is a sectional view of the embedded memory assembly 100 of FIG. 1 showing one of the electrical vias 201 extending between the signal leads 111 and the microprocessor 101 to transfer the control and power signals. The memory devices 103 are mounted upside down so that electrical contacts on the memory devices 103 couple with electrically conductive ball bonds 301 which in turn couple to the signal leads 111. Non-conductive ball bonds 303 support portions of the memory devices 103 adjacent to the lead frame 109. A die coat 203 is used to electrically isolate the contact frame 109 from the top surface of the microprocessor 101. The electrical contact frame 109 is adhered to adhesive tape 205 placed on the die coat 203.

Figure 4:
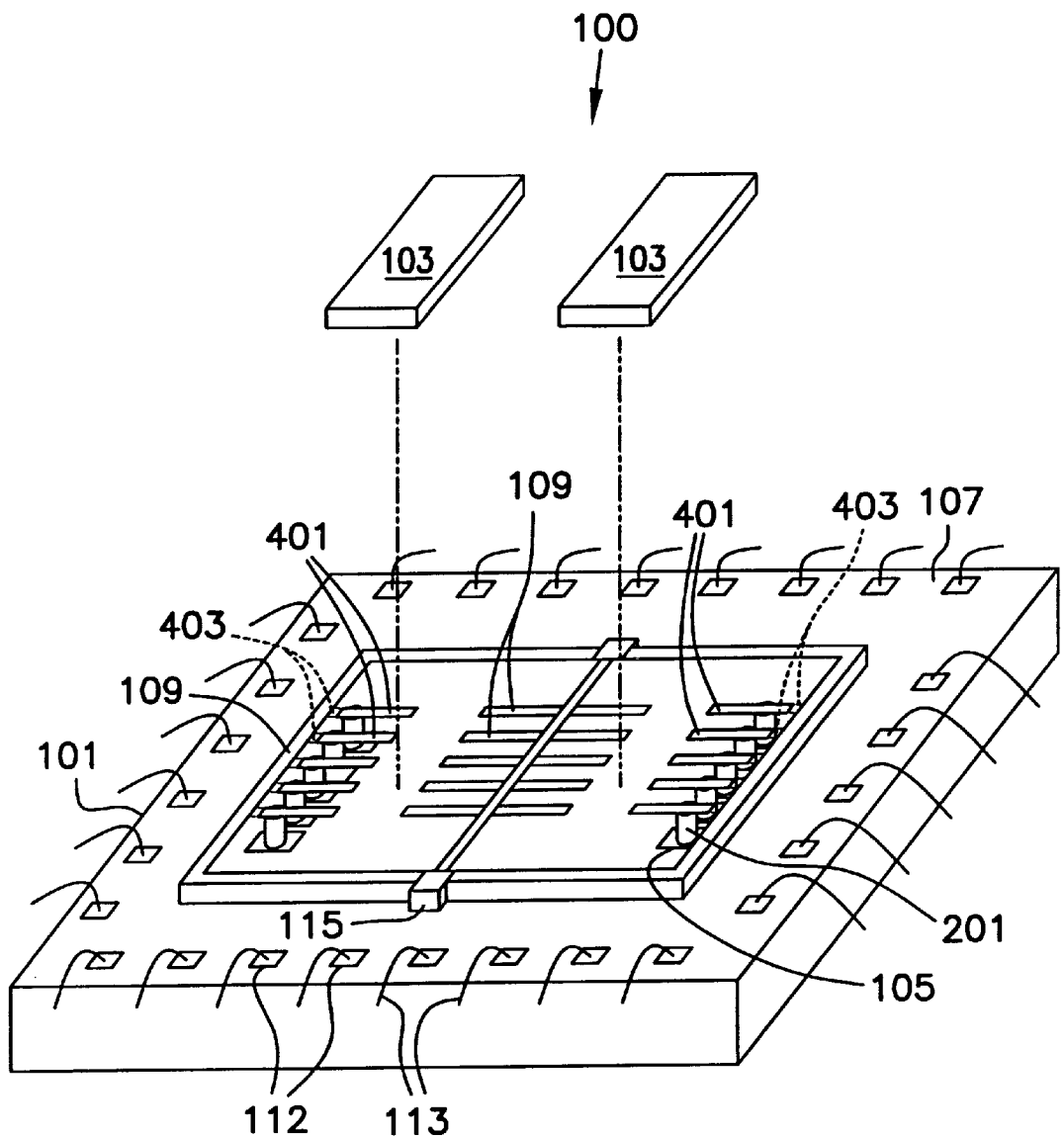
FIG. 4 is a perspective view of an alternate embodiment of the embedded memory assembly.

In another alternate embodiment, the electrical contact pads 105 are disposed around the perimeter of the top surface 107 of the microprocessor as shown in FIG. 4. The signal leads 401 are coupled to the contact pads 105 using conventional bonding technology well-known in the art. In this embodiment, tie bars 403 are removed from the lead frame 109 to electrically isolate the memory devices 103 from the lead frame 109. In an alternate embodiment, the tie bars 403 are non-conductive and remain in place.

Figure 5:
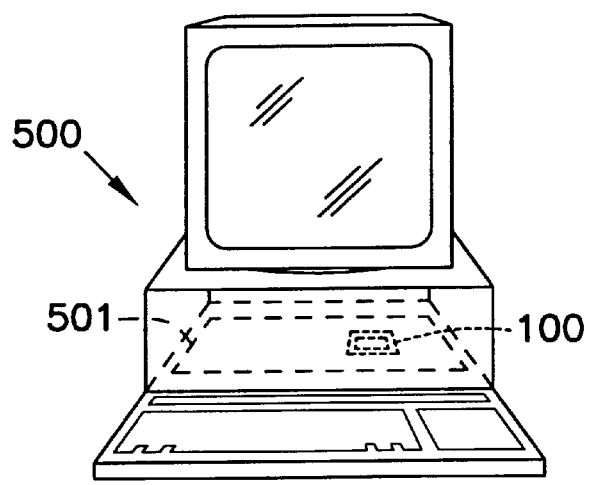
FIG. 5 is a perspective view of a personal computer having a motherboard on which is mounted the embedded memory assembly of FIG. 1.

FIG. 5 is a perspective view of a personal computer 500 having a motherboard 501 on which is mounted the embedded memory assembly 100 of FIG. 1.

Figure 6A:
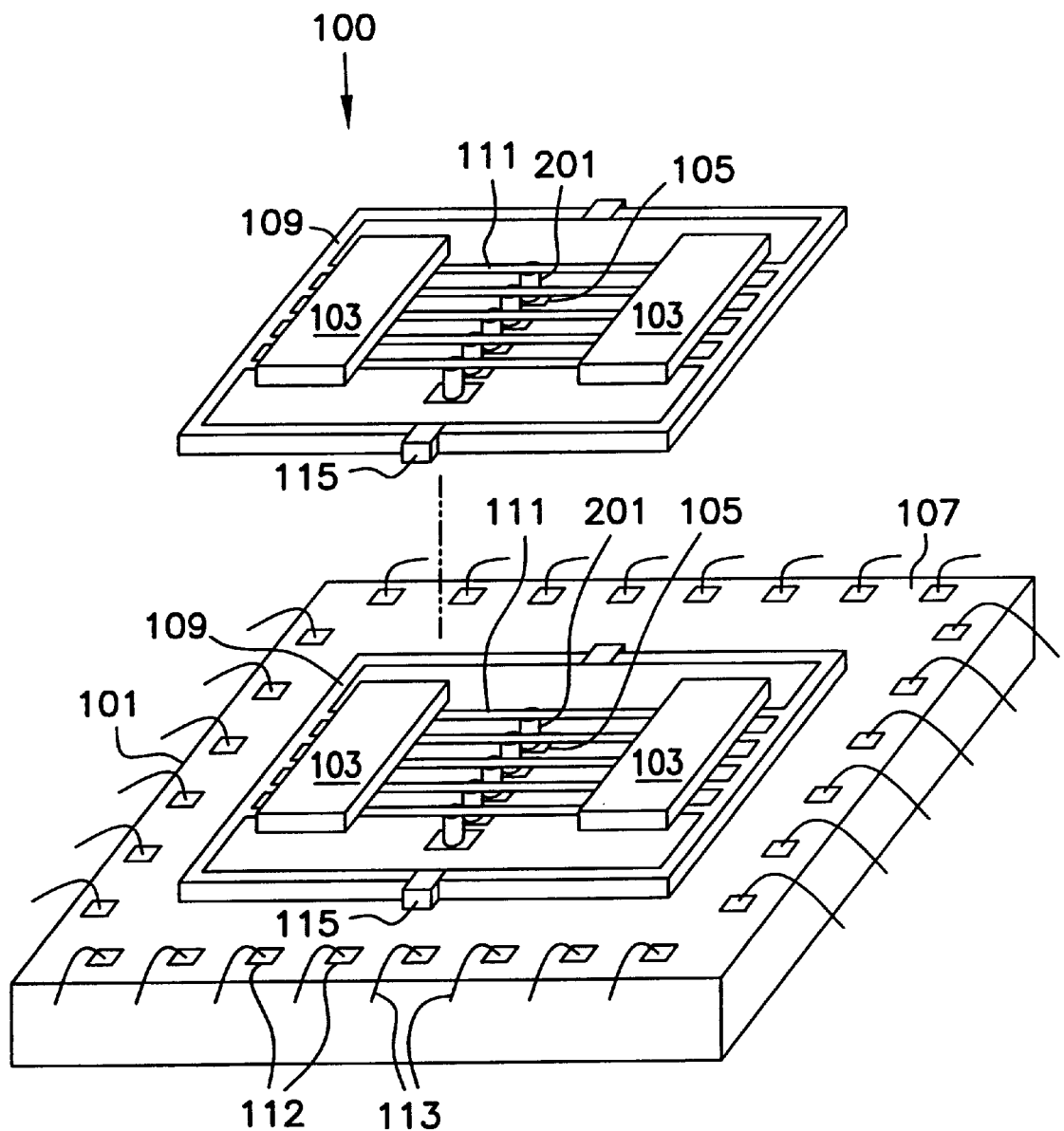
FIG. 6A is a partially exploded view of an alternate embodiment of the embedded memory assembly showing a stacking arrangement for the memory devices.
Figure 6B:
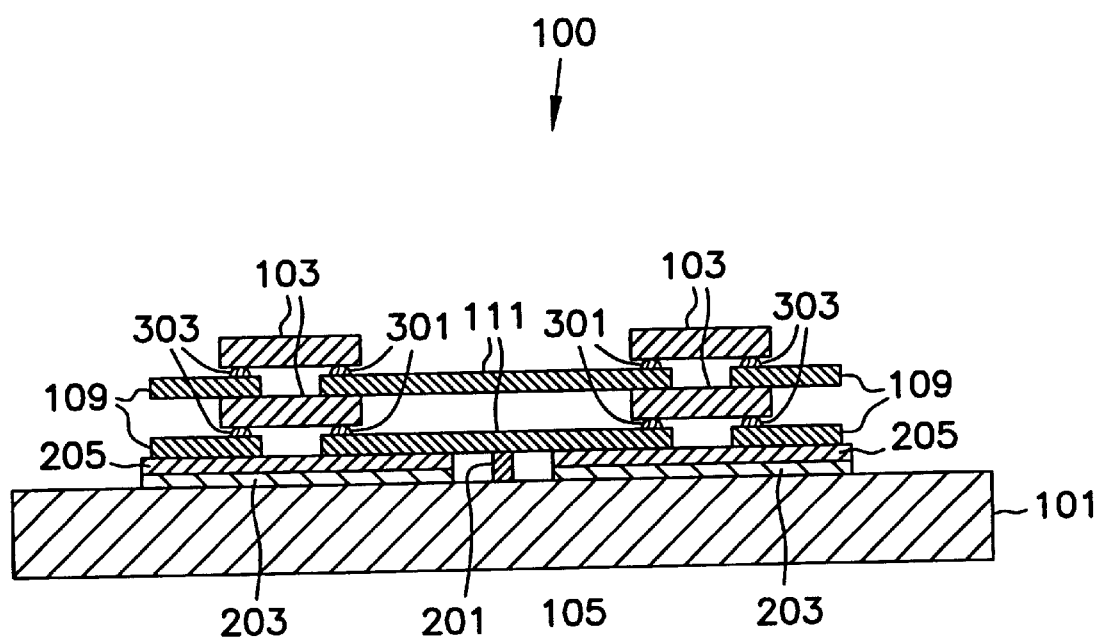
FIG. 6B is a sectional view of the embedded memory assembly of FIG. 6A.

The electrical contact frame is also suitable for stacking one atop another as shown in FIGS. 6A and 6B. Such a stacking arrangement can be used to embed more memory devices in an integrated circuit package than will fit on a single contact frame. FIGS. 6A and 6B do not illustrate the coupling of the signal lines from all the frames to the integrated circuit due to the complexity of the interconnections in a stacked arrangement. Such couplings are easily understood by one skilled in the art based the single contact frame embodiments shown in FIGS. 1–4 and the corresponding descriptions.

Another aspect of the invention is a method of embedding memory devices 103 in an integrated circuit assembly 100. The method deposits a plurality of electrical contact pads 105 on a top surface 107 of the integrated circuit 101. The electrical contact pads 105 are coupled to memory-related control and power signals in the integrated circuit 101. The memory devices 103 are affixed to an electrical contact frame 109 which carries a plurality of signal leads 111. The memory devices 103 are coupled to the signal leads 111. The electrical contact frame 109 is mounted adjacent to the top surface 107 of the integrated circuit 101, and the signal leads 111 are coupled to the electrical contact pads 105 to complete control and power circuits between the integrated circuit 101 and the memory devices 103.

Other mechanisms for affixing the frame to the integrated circuit, and the memory to the frame, will be apparent to those skilled in the art, as will the use of alternate materials and manufacturing methods for making the embedded memory assembly.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An embedded memory for coupling to memory-related control and power signals in an integrated circuit, the embedded memory comprising:

a first electrical contact frame for mounting adjacent to a plurality of electrical contact pads on the integrated circuit and operable for later coupling to the integrated circuit;

a first plurality of signal leads coupled to the first electrical contact frame for further coupling to the plurality of electrical contact pads; and a first plurality of memory devices affixed to the contact frame and coupled to the first plurality of signal leads.

2. The embedded memory of claim 1, wherein electrical vias couple the first plurality of signal leads to the electrical contact pads.

3. The embedded memory of claim 2, wherein the electrical vias are ball bonds.

4. The embedded memory of claim 2, wherein the electrical vias are electrically conductive pillars.

5. The embedded memory of claim 1, wherein the first plurality of signal leads are electrically isolated from the first electrical contact frame.

6. The embedded memory of claim 1 further comprising:

a second electrical contact frame stacked on top of the first electrical contact frame;

a second plurality of signal leads coupled to the second electrical contact frame for further coupling to the plurality of electrical contact pads; and a second plurality of memory devices coupled to the second plurality of signal leads.

7. A method of creating an embedded memory comprising:

affixing a plurality of memory devices onto an electrical contact frame;

coupling the memory devices to a plurality of signal leads on the contact frame;

mounting the electrical contact frame adjacent to a surface of an integrated circuit which has electrical contact pads disposed thereon for routing memory-related control and power signals in the integrated circuit; and 8. The method of claim 7, further comprising electrically isolating the signal leads from the contact frame.

9. An embedded memory for coupling to an integrated circuit having electrical contact pads disposed on a surface, the embedded memory operable for later coupling to the integrated circuit, the embedded memory comprising:

a frame for mounting to a surface of the integrated circuit;

a plurality of memory devices affixed to the frame; and a plurality of signals coupled to the plurality of memory devices for transferring control and power signals between the integrated circuit and the memory devices.

10. An embedded memory assembly for coupling to memory-related control and power signals in a microprocessor, the embedded memory assembly comprising:

a first electrical contact frame for mounting adjacent to a plurality of electrical contact pads on the microprocessor, wherein the electrical contact pads route the memory-related control and power signals;

a first plurality of signal leads coupled to the first electrical contact frame for further coupling to the plurality of electrical contact pads; and a first plurality of memory devices affixed to the contact frame and coupled to the first plurality of signal leads.

11. The embedded memory assembly of claim 10, wherein electrical vias couple the first plurality of signal leads to the electrical contact pads.

12. The embedded memory assembly of claim 11, wherein the electrical vias are ball bonds.

13. The embedded memory assembly of claim 11, wherein the electrical vias are electrically conductive pillars.

14. The embedded memory of claim 10, wherein the first plurality of signal leads are electrically isolated from the first electrical contact frame.

15. An embedded memory assembly for coupling to memory-related control and power signals in a microprocessor, the embedded memory assembly comprising:

a first electrical contact frame for mounting adjacent to a plurality of electrical contact pads on the microprocessor, wherein the electrical contact pads route the memory-related control and power signals;

a first plurality of signal leads coupled to the first electrical contact frame for further coupling to the plurality of electrical contact pads;

a first plurality of memory devices affixed to the contact frame and coupled to the first plurality of signal leads;

a second electrical contact frame stacked on top of the first electrical contact frame;

a second plurality of signal leads coupled to the second electrical contact frame for further coupling to the plurality of electrical contact pads; and a second plurality of memory devices coupled to the second plurality of signal leads.

16. An embedded memory assembly comprising:

a microprocessor having a plurality of electrical contact pads disposed on the center of a top surface of the microprocessor, the electrical contact pads coupled to memory-related control and power signals in the microprocessor;

an electrical contact frame mounted adjacent to the top surface of the microprocessor and having a plurality of signal leads coupled to the plurality of electrical contact pads; and a plurality of memory devices affixed to the contact frame and coupled to the signal leads.

17. An embedded memory assembly comprising:

a microprocessor having a plurality of electrical contact pads disposed around the perimeter of a top surface of the microprocessor, the electrical contact pads coupled to memory-related control and power signals in the microprocessor;

an electrical contact frame mounted adjacent to the top surface of the microprocessor and having a plurality of signal leads coupled to the plurality of electrical contact pads; and a plurality of memory devices affixed to the electrical contact frame and coupled to the signal leads.

18. A method of creating an embedded memory comprising:

affixing a plurality of memory devices onto an electrical contact frame;

coupling the memory devices to a plurality of signal leads on the contact frame; and mounting the electrical contact frame adjacent to a surface of an integrated circuit which has electrical contact pads disposed thereon for routing memory-related control and power signals in the integrated circuit.

19. An embedded memory assembly comprising:

an microprocessor having a plurality of electrical contact pads disposed on the center of a top surface of the microprocessor, the electrical contact pads coupled to memory-related control and power signals in the microprocessor; and a stack of electrical contact frames, each electrical contact frame comprising a plurality of signal leads and having affixed thereto a plurality of memory devices coupled to the signal leads which are further coupled to the contact pads, wherein one of the electrical contact frames is mounted adjacent to the top surface of the microprocessor.

20. An embedded memory assembly comprising:

a microprocessor having a plurality of electrical contact pads disposed around the perimeter of a top surface of the microprocessor, the electrical contact pads coupled to memory-related control and power signals in the microprocessor; and a stack of electrical contact frames, each electrical contact frame comprising a plurality of signal leads and having affixed thereto a plurality of memory devices coupled to the signal leads which are further coupled to the electrical contact pads, wherein one of the electrical contact frames is mounted adjacent to the top surface of the microprocessor.

* * * * *

UNITED STATES PATENT AND TRADEMARK OFFICE
CERTIFICATE OF CORRECTION

PATENT NO.    : 6,160,312
DATED         : December 12, 2000
INVENTOR(S)   : George B. Raad It is certified that error appears in the above-identified patent and that said Letters Patent is hereby corrected as shown below:

Title page, Item [54], and Column 1, line 1,
"ENBEDDED" should read -- EMBEDDED --.

Title page,
Item [62], Related U.S. Application Data, "Division of Application No. 08/990,303" should read -- Continuation of Application No. 08/990,303 --.

Column 1,
Line 13, "are" should read -- is --.
Line 44, delete second comma after "circuit".

Column 2,
Line 2, "enbedded" should read -- embedded --.

Column 3,
Line 24, "show" should read -- shown --.

Column 5,
Line 1, "em bedded" should read -- embedded --.
Line 18, after "and" insert -- ¶ further coupling the signal leads to the electrical contact pads. --
Line 27, "signals coupled" should read -- signal leads coupled --.

Column 6,
Line 42, "an microprocessor" should read -- a microprocessor --.

Signed and Sealed this

Fifteenth Day of October, 2002

*Attest:*

JAMES E. ROGAN
*Attesting Officer*   *Director of the United States Patent and Trademark Office*